United States Patent [19]

Mäkinen

[11] Patent Number: 4,703,558
[45] Date of Patent: Nov. 3, 1987

[54] ASSEMBLY SYSTEM

[76] Inventor: Matti Mäkinen, Lorettostrasse 57, 7800 Freiburg, Fed. Rep. of Germany

[21] Appl. No.: 830,702

[22] Filed: Feb. 18, 1986

[51] Int. Cl.$^4$ .................. B23P 21/00; B65G 47/00
[52] U.S. Cl. ................................ 29/784; 198/346
[58] Field of Search ............ 29/784, 783, 791, 799; 198/346, 346.1

[56] References Cited

U.S. PATENT DOCUMENTS

| | | | |
|---|---|---|---|
| 2,850,139 | 9/1958 | Bishop | 198/346 |
| 2,866,533 | 12/1958 | Ohrnell | 198/346 |
| 2,896,314 | 7/1959 | Godwin et al. | 29/784 |
| 3,191,745 | 6/1965 | Karcher et al. | 198/346 |
| 4,473,935 | 10/1984 | Tatsuura et al. | 198/346 L |
| 4,511,024 | 4/1985 | Long | 198/346 |
| 4,531,284 | 7/1985 | Matsuura et al. | 29/784 |

*Primary Examiner*—Howard N. Goldberg
*Assistant Examiner*—Steven Nichols
*Attorney, Agent, or Firm*—Ladas & Parry

[57] ABSTRACT

The present invention relates to a system for assembling products of various raw materials and components, mainly for so-called light industry. Raw materials and components are transported on standard-size pallets, by means of conveyor robots, all through the system from storages to packing stations wherefrom assembled products are shipped. The system preferable includes a number of production preparation stations for serving a plurality of subsequent intermediate handling stations each of which serves an assembly line with a plurality of work stations pairwise on opposite sides of respective assembly line conveyor robots. Display terminals are provided for communication between the different kinds of stations, as well as control means for operating the conveyor robots. Even a fully automated production is possible.

9 Claims, 5 Drawing Figures

ASSEMBLY SYSTEM

Assembly production is typically divided into different assembly stages, intermediate testing and checking. A product can consist of 20 to 2000 components, its size increasing as production advances.

Nowadays quality is of ever increasing importance. As components decrease in size, their handling has to become ever more accurate. And, in production stages the later a fault becomes apparent the more it will cost.

Previous assembly systems are inflexible and involve a large production of manual assembly work, such as placing components on circuit boards, soldering and testing.

It is the object of the present invention to provide a new assembly system which is flexible and by means of which the manual work can be either fully automated or its stages can be considerably speeded up by the use of various automatic tools, thus increasing productivity by accelerating the material turnover, i.e. the product's passage through assembly.

The above object is basically accomplished by means of an assembly system which comprises at least one assembly line with a plurality of work stations provided with required tools for performing predetermined assembling operations, at least one robot conveyor for delivering components to respective assembly line work stations and for delivering assembled products from the respective work stations, control means for operating said at least one robot conveyor, and standard-size pallets for receiving said components and assembled products, for storage and transport, arranged to be carried by said at least one robot conveyor, the work stations being positioned to form at least one pair of opposite sides of the robot conveyor, the opposite work stations preferably being mirror images of each other, each pair of work stations having a common table surface, the central portion of which is reserved for receiving pallets from the assembly line robot conveyor and for feeding pallets thereto, the common table surface being divided into sections dimensioned according to said pallets and provided with edge conveyor bands for moving pallets in desired directions, control means being provided for operating said conveyor bands, and each work station comprising a lift operable to place incoming pallets into a pallet storage and to lift said pallets from the surface in level with the table surface.

In addition, the work stations may comprise testing devices for testing the product being manufactured, and the work station may be arranged to operate automatically.

Starting from only one assembly line the system of the invention can conveniently be enlargened by and by. Thus, for complicated products requiring a large amount of different components (raw materials) and assembling operations, a preferred embodiment of the system comprises at least one production preparation station for sorting raw materials and components brought thereto on standard-size pallets by a first robot conveyor from a storage, a plurality of subsequent intermediate handling stations in communication with said preparation station via display terminals, a second robot conveyor being provided for the transportation of raw material and component pallets to the intermediate stations, a plurality of assembly lines, one for each intermediate handling station, each assembly line comprising a plurality of work stations provided with required tools for performing predetermined assembling operations and in communication with the respective intermediate handling station via display terminal means, an assembly line robot conveyor being provided for the transportation of component pallets from the respective intermediate handling station and back thereto and further to said second robot conveyor, control means for operating said first, second and assembly line robot conveyors, and a packing station arranged after the intermediate handling stations at the end of said second robot conveyor.

Preferably the entire material flow is arranged to travel on pallets of standard size but of different surface configuration, according to the respective needs. The pallets' movements are preferably automated and they can throughout the transportation be protected against dirt and dust.

In the following will be described a preferred embodiment of the present assembly system, with reference to the accompanying drawing.

Figure 1:
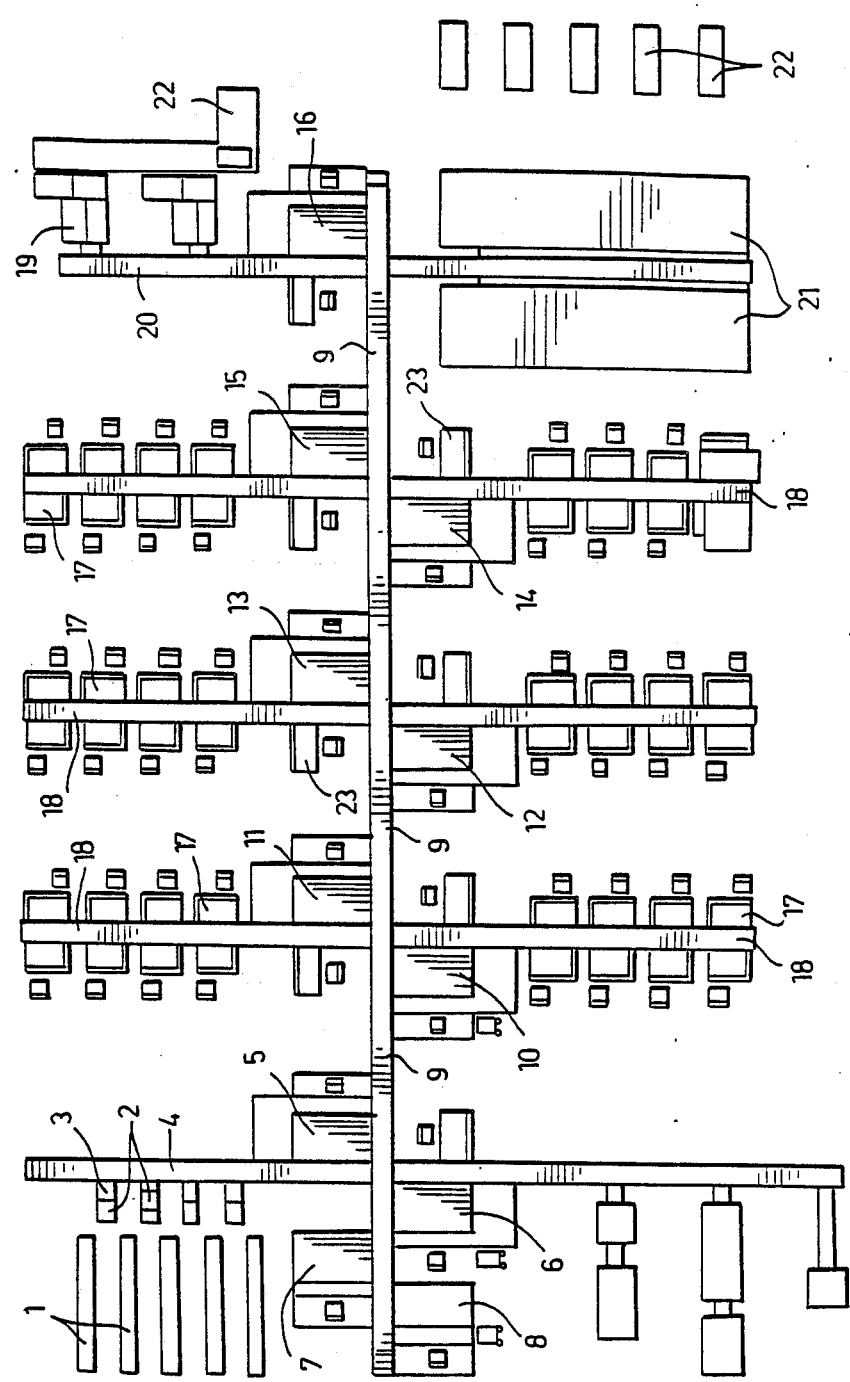
FIG. 1 is schematic general view of the assembly system.

In the drawing reference numeral 1 indicates a storage for semi-finished products and raw materials. Pallets for receiving the semi-finished products and the raw materials are 2, which pallets are moved by conveyors 3 to a first robot conveyor 4. Production preparation stations are indicated 5,6,7 and 8. At the preparation stations components are assorted e.g. according to the size of the production patch and tools and equipment are kept and prepared for distribution. In the arrangement of FIG. 1, the first robot conveyor 4 serves the preparation stations 5 and 6 while the preparation stations 7 and 8 are served otherwise or can mainly be handling the aforementioned tools and equipment.

The components, equipment and tools used in production vary greatly in amount, size and form. This material flow from leads to tiny washers and sensitive electronic components, requires a system of its own into which it is packed as production advances.

To guarantee flexible assembly, the product must be easily moveable at the work station. It must be rotatable in any direction.

Figure 4:
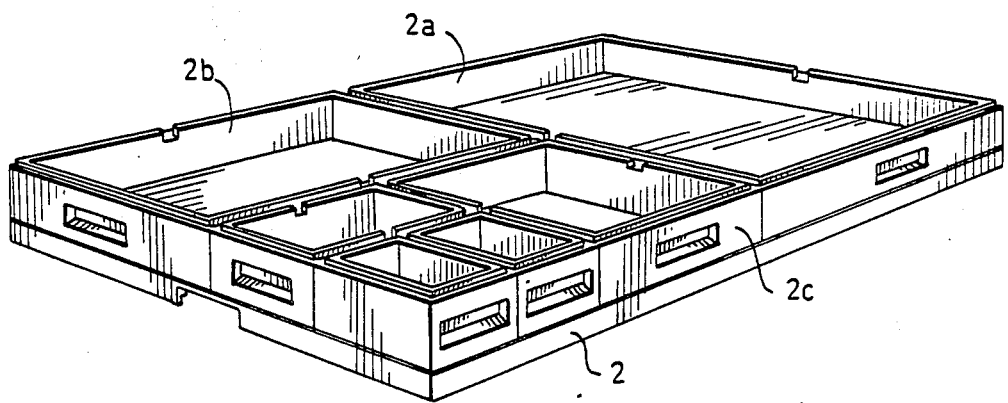
FIG. 4 shows a pallet employed in the system.

In the system of the invention, the entire material flow moves on pallets of standard size. Such a pallet arrangement is illustrated in FIG. 4 and includes a basic pallet 2 upon which are placed boxes 2a, 2b, 2c etc. of different sizes for components and equipment, according to various needs. For special work movements and positions, additional multifunctional assembly pallets and jigs may be used. An advantage of such a standardized pallet system is its suitability for robot operation and production, whereat the demands regarding exactness of dimension and positioning are much stricter than those required of manual work.

From the preparation stations starts a second robot conveyor 9, in the following also referred to as the main robot conveyor. Along the main robot conveyor are arranged a plurality of intermediate handling stations 10 to 16, each of the intermediate handling stations 10 to 15 serving and assembly line comprising e.g. eight work stations 17 by means of third robot conveyors 18, in the following also referred to as assembled line conveyors. The intermediate handling station 16, at the end of the assembly system, serves e.g. two packing stations 19 by means of a robot conveyor 20 similar to the assembly line robot conveyors. The robot conveyor 20 can preferably also serve a station for e.g. testing of the products under heat, blocks 21. From the packing stations the packed products are delivered further for shipping, blocks 22. Block 23 indicates a position for supervising personal which, however, in many cases is superfluous.

The conveyor robots 18' moving along the assembly lines are arranged for automatically taking care of the transportation carried out between the work stations 17 and the respective intermediate handling station by means of pallets 2, the main conveyor robot 9' being arranged for the transportation of the raw material and component pallets to the intermediate stations and for the transportation of the product to be manufactured on said pallets 2 from one intermediate handling station to another and finally to the packaging station. The conveyor robots 4, 9' and 18' are in motion only when necessary and may be provided with means 40 for protecting the pallets from dust and moisture.

The intermediate handling stations 10–16 comprise a paternoster 25 provided with shelves 26 for intermediate storage of the raw material and component pallets coming from the preparation stations 5–8 and the pallets 2 with semi-finished parts coming from the assembly lines by means of the conveyor robots 18'. Further, the intermediate handling station 8 comprises a storage 27 for empty pallets.

The work stations 17 in each assembly line are positioned in pairs on opposite sides of the conveyor line 18 extending therebetween, the work stations facing each other being mirror images, whereby there are several pairs of work stations 17 side by side along the side conveyor line 19. Each pair of work stations 17 has a common table surface 28, the central portion of which is reserved for the movement of the conveyor robot 18' and for the pallets 2 to be displaced. Each work station 17 comprises a lift operated by control means 29 of the work station so as to place the incoming raw material and component pallets 2 into a pallet storage 30 of the work station and to lift said pallets from the storage 30 into level with the table surface 28. Testing devices for intermediate testing of the product to be manufactured can be positioned in connection with a work station 17. The assembly lines can be fully automated, whereby operators 37 are replaced by automatical assembling robots at the work stations 17.

Figure 5:
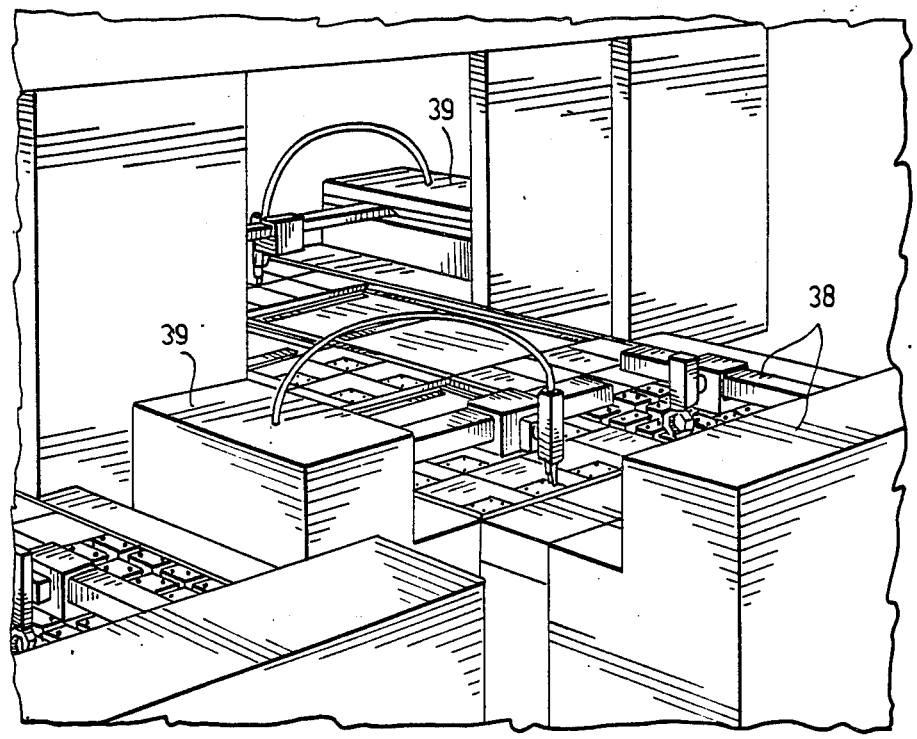
FIG. 5 shows an automatic work station.

The control logic of such assembling robots 38 and 39 are connected to the control means 29 of the work station, as schematically illustrated in FIG. 5.

The assembly system operates as follows:

The robot conveyor 4 brings the component and raw material pallets 2 from the storage 1 to the production preparation station 5–8, wherein the goods contained in said pallets 2 are assorted to be passed to the intermediate handling stations 10–15. By means of display terminals, messages are sent from the intermediate handling stations to the preparation stations concerning the required materials and tools, which are thereafter passed from the preparation station 6 to the respective intermediate handling station by means of the main conveyor robot 9', on pallets 2. The pallets 2 containing materials and tools are stored at the respective intermediate handling station on the shelves 26 of the paternoster 25. The work stations 17 communicate with the display terminals 34 of the respective intermediate handling station, whereby a message can be sent from each work stations 17 to the intermediate handling station concerning the materials required, which materials the conveyor robot 18' passes to the work station 17. The conveyor robot 18' also transports empty pallets 2, or an assembled product on a pallet 2 from the work station 17 to the intermediate handling station wherein the empty pallets 2 are stored in the storage 27 and a product which is being assembled a pallet 2 is transported by means of the main robot conveyor 9 to a subsequent intermediate handling station. When a pallet 2 carrying the product to be assembled has been passed through all necessary assembly lines and intermediate handling stations, it arrives at the packaging station 19, wherefrom the finished and packed product is moved into a storage, for shipping.

Figure 2:
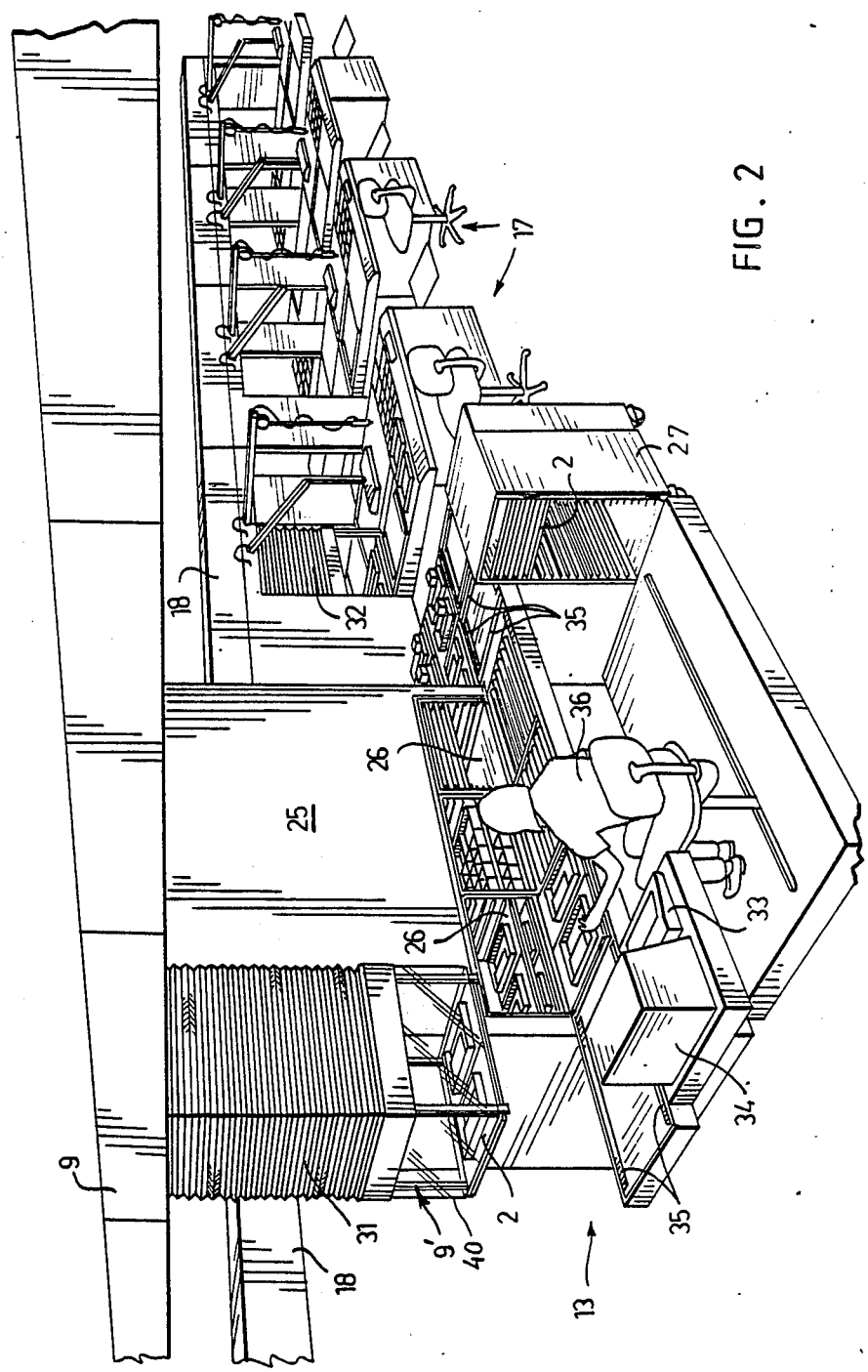
FIG. 2 shows an assembly line seen from the intermediate handling station.

At each intermediate handling stations 10–15 and at each work station 17 the conveyor robots 9' and 18', respectively are movable up and down carried by bellows 31 and 32 and operated by control means 33 and 29. Reference 34 at the intermediate handling station shown in FIG. 2 indicates a display terminal through which the operator communicates with the preparation stations, other intermediate handling stations and with the respective assembly line work stations 17. 35 indicates conveyor bands acting at the edges of the pallets 2 for desired movement thereof on the operating tables both at the intermediate handling stations 10–15 and at the work stations. At the intermediate station 13 the pallets 2 are received left of the operator 36 who either stores the pallets in the paternoster device 25 or transfers pallets directly or from the paternoster shelves 26 to the right and around the corner of the paternoster 25 wherefrom the assembly line conveyor robot 18' picks them e.g. by means of pallet edge grippers (not shown) up and delivers them to the respective work station 17.

Operator 36 can be replaced by a handling robot basically in the same manner as illustrated in FIG. 5 for a work station.

Figure 3:
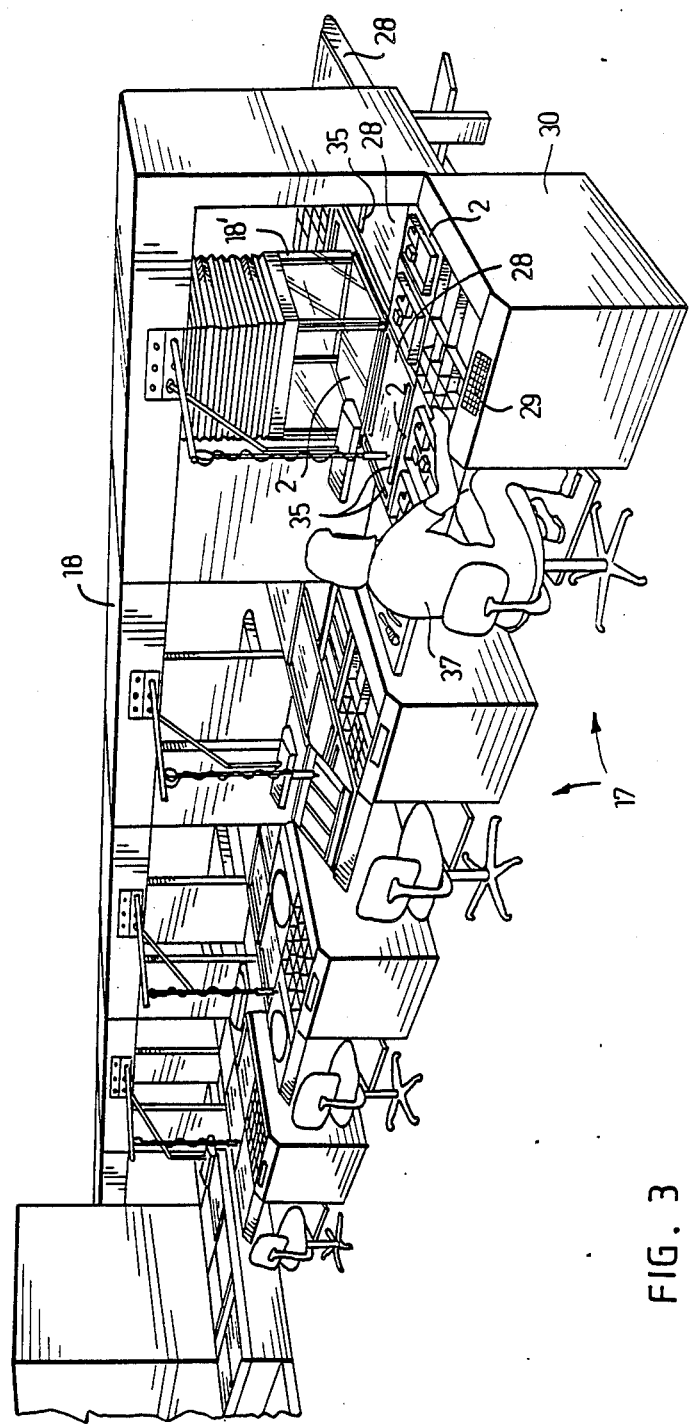
FIG. 3 shows an assembly line from the work station end.

FIG. 3 illustrates the similar pallet handling at a work station 17. Robot 18' delivers the pallets 2 at the center of a table 28 in common for two opposite work stations, and the operator 37 brings the pallets to move, carried by edge band conveyors 35 arranged at the edges of pallet-dimensioned sections of the table 28, using the control means 29.

The same control means 29 are used for operating the aforementioned pallet lift which is situated in the pallet storage 30 and therefore is not visible in FIG. 3. The pallet lift can of course also be operated by the assembling robots 38 and 39 shown in FIG. 4.

Transportation of pallets from work station 17 to an intermediate station 13 works in the same way but in opposite directions. At the preparation stations 5–8 the handling of materials (pallets) takes place in the same manner as at the intermediate handling stations.

I claim:

1. A system for assembling a product out of a variety of raw materials and components, comprising at least one production preparation station for sorting raw materials and components brought thereto on standard-size pallets by a first robot conveyor from a storage, a plurality of subsequent intermediate handling stations in communications with said preparation station via display terminals, a second robot conveyor being provided for the transportation of raw material and component pallets to the intermediate stations, a plurality of assembly lines, one for each intermediate handling station, each assembly line comprising a plurality of work stations provided with required tools for performing predetermined assembling operations and in communication with the respective intermediate handling station via display terminal means, the work stations being positioned to form at least one pair on opposite sides of the robot conveyor, the opposite work stations preferably being mirror images of each other, each pair of work stations having a common table surface, the central portion of which is reserved for receiving pallets from the assembly line robot conveyor and for feeding pallets thereto, the common table surface being divided into sections dimensioned according to said pallets and provided with edge conveyor bands for moving pallets in desired directions, control means being provided for operating said conveyor bands, and each work station comprising a lift operable to place incoming pallets into a pallet storage and to lift said pallets from the storage in level with the table surface, an assembly line robot conveyor being provided for the transportation of component pallets from the respective intermediate handling station and back thereto and further to said second robot conveyor, control means for operating said first, second and assembly line robot conveyors; and a packing station arranged after the intermediate handling stations at the end of said second robot conveyor.

2. A system according to claim 1, wherein the assembly lines are arranged tranversely to said second robot conveyor, the assembly line robot conveyors being arranged underneath the second robot conveyor.

3. A system according to claim 1, wherein each intermediate handling station comprises a paternoster provided with shelves for intermediate storage of the raw material and component pallets brought from the preparation station by means of said second robot conveyor and of the pallets with semi-finished products brought back from the assembly line by means of the respective assembly line robot conveyor.

4. A system according to claim 1, wherein each intermediate handling station further comprises a storage for empty pallets.

5. A system according to claim 1, which further comprises testing stations positioned adjacent the intermediate handling stations for intermediate checking of the product to be manufactured.

6. A system according to claim 1, wherein all robot conveyors are of the same kind.

7. A system according to claim 1, wherein the robot conveyors are arranged to move along rails.

8. A system according to claim 1, wherein the robot conveyors are operated individually.

9. A system according to claim 1, wherein the robot conveyors comprise means for protecting the pallets from dust and moisture.

* * * * *